United States Patent
Chen et al.

(10) Patent No.: US 11,350,534 B1
(45) Date of Patent: May 31, 2022

(54) TELECOMMUNICATION CABINET WITH REPLACEABLE CABINET DOOR MODULE

(71) Applicant: SUPER MICRO COMPUTER, INC., San Jose, CA (US)

(72) Inventors: Chia-Wei Chen, Taipei (TW); Tienen Chao, San Jose, CA (US)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 17/117,882

(22) Filed: Dec. 10, 2020

(51) Int. Cl.
| | |
|---|---|
| *G06F 1/16* | (2006.01) |
| *H05K 5/00* | (2006.01) |
| *H05K 7/00* | (2006.01) |
| *H05K 5/02* | (2006.01) |
| *E05D 7/10* | (2006.01) |
| *H05K 7/20* | (2006.01) |
| *H05K 7/18* | (2006.01) |

(52) U.S. Cl.
CPC ......... *H05K 5/0226* (2013.01); *E05D 7/1044* (2013.01); *H05K 7/186* (2013.01); *H05K 7/20536* (2013.01); *E05Y 2900/606* (2013.01)

(58) Field of Classification Search
CPC .. H05K 5/0226; H05K 5/0217; H05K 5/0204; H05K 7/186; H05K 7/20536; H05K 7/18
See application file for complete search history.

(56) References Cited

U.S. PATENT DOCUMENTS

| | | | |
|---|---|---|---|
| 4,516,818 A | 5/1985 | Johnston et al. | |
| 7,589,277 B2* | 9/2009 | Kessler | H05K 5/0247 |
| | | | 174/480 |
| 9,155,221 B2* | 10/2015 | Dolan | H05K 5/02 |
| 10,021,807 B2* | 7/2018 | Franck | H05K 7/18 |
| 10,172,256 B2* | 1/2019 | Walsh | H05K 7/1492 |
| 10,874,036 B2* | 12/2020 | Yang | H04Q 1/035 |
| 2013/0214652 A1 | 8/2013 | Mathewson | |
| 2013/0219947 A1* | 8/2013 | Yang | H05K 7/20609 |
| | | | 62/426 |
| 2016/0302326 A1* | 10/2016 | Chen | H05K 7/20618 |

* cited by examiner

*Primary Examiner* — Anthony M Haughton
(74) *Attorney, Agent, or Firm* — Patrick D. Benedicto

(57) ABSTRACT

A telecommunication cabinet includes a cabinet body, a cabinet door module, and a detachable hinge. The cabinet body includes a cabinet and a telecommunication module disposed in the cabinet. The cabinet door module includes a cabinet door and a function module. The detachable hinge includes a first shaft seat, a second shaft seat and a pivot shaft. The cabinet door module is pivotally rotatable with respect to the cabinet through the pivot shaft inserted to the first shaft seat and the second shaft seat. The cabinet door module is detachably coupled to the cabinet body to facilitate replacement.

8 Claims, 4 Drawing Sheets

TELECOMMUNICATION CABINET WITH REPLACEABLE CABINET DOOR MODULE

BACKGROUND OF THE INVENTION

Technical Field

The technical field relates to a telecommunication cabinet, and more particularly relates to a hanging-type telecommunication cabinet.

Description of Related Art

Telecommunications is evolving from the 4G to the 5G era. With the increase of mobile users' demand for network bandwidth and speed, small cells are commonly utilized to deploy Ultra-Dense Networks (UDN) in order to meet these heightened requirements.

The millimeter wave used by 5G technology is susceptible to interference and interruption, so a larger number of small cells must be deployed to achieve requisite coverage. In addition, small cells are usually deployed in densely populated metropolitan areas where demand is greatest. In order to reduce the amount of space occupied and avoid interference or interruption, current plans for 5G base stations call for installation in high places such as telecommunication poles, signal poles, street lamp poles, or elevated bridges. However, compared to 4G base stations, 5G base stations have higher power consumption and the overall weight and volume are larger. Thus, these aspects make it difficult to install 5G base stations at high places.

In view of the above drawbacks, the inventor proposes this disclosure based on his expert knowledge and elaborate research in order to solve the problems in the prior art.

SUMMARY OF THE INVENTION

It is an objective of this disclosure to provide a telecommunication cabinet with a replaceable cabinet door module, in which the cabinet door module is coupled to the cabinet body through detachable hinges. Therefore, the purpose of split-type assembly and quick detachment are achieved to increase the convenience of installation.

In order to achieve the objective mentioned above, this disclosure provides a telecommunication cabinet with replaceable cabinet door module including a cabinet body, a cabinet door module, and a detachable hinge. The cabinet body includes a cabinet and a telecommunication module disposed in the cabinet. The cabinet door module includes a cabinet door covering the cabinet body correspondingly and a function module disposed in the cabinet door. The detachable hinge includes a first shaft seat disposed at one side of the cabinet, a second shaft seat disposed at one side of the cabinet door and a pivot shaft. The cabinet door module is pivotally rotatable with respect to the cabinet through the pivot shaft inserted to the first shaft seat and the second shaft seat. The cabinet door module is detachably coupled to the cabinet body to facilitate replacement.

It is another objective of this disclosure to provide a telecommunication cabinet with a replaceable cabinet door module, in which the telecommunication cabinet is attached to a fixed object above ground level through brackets. Therefore, the telecommunication cabinet may not occupy ground space, and the millimeter wave emitted from the telecommunication cabinet may be protected from interference by other electronic devices or blocking by existing buildings and structures.

Comparing to the related art, the telecommunication cabinet of this disclosure increases the safety and convenience of installation and maintenance with its split-type assembly. As previously stated, the telecommunication cabinet may be attached to a fixed object at a high point through brackets, where installation and maintenance are more difficult and dangerous to perform. The cabinet door module disclosed herein may be quickly connected with the cabinet body through detachable hinges or may be quickly detached from the cabinet body so that the cabinet door module may be easily replaced with other cabinet door modules having other functions without needing to move or remove the entire cabinet assembly.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE EMBODIMENTS

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
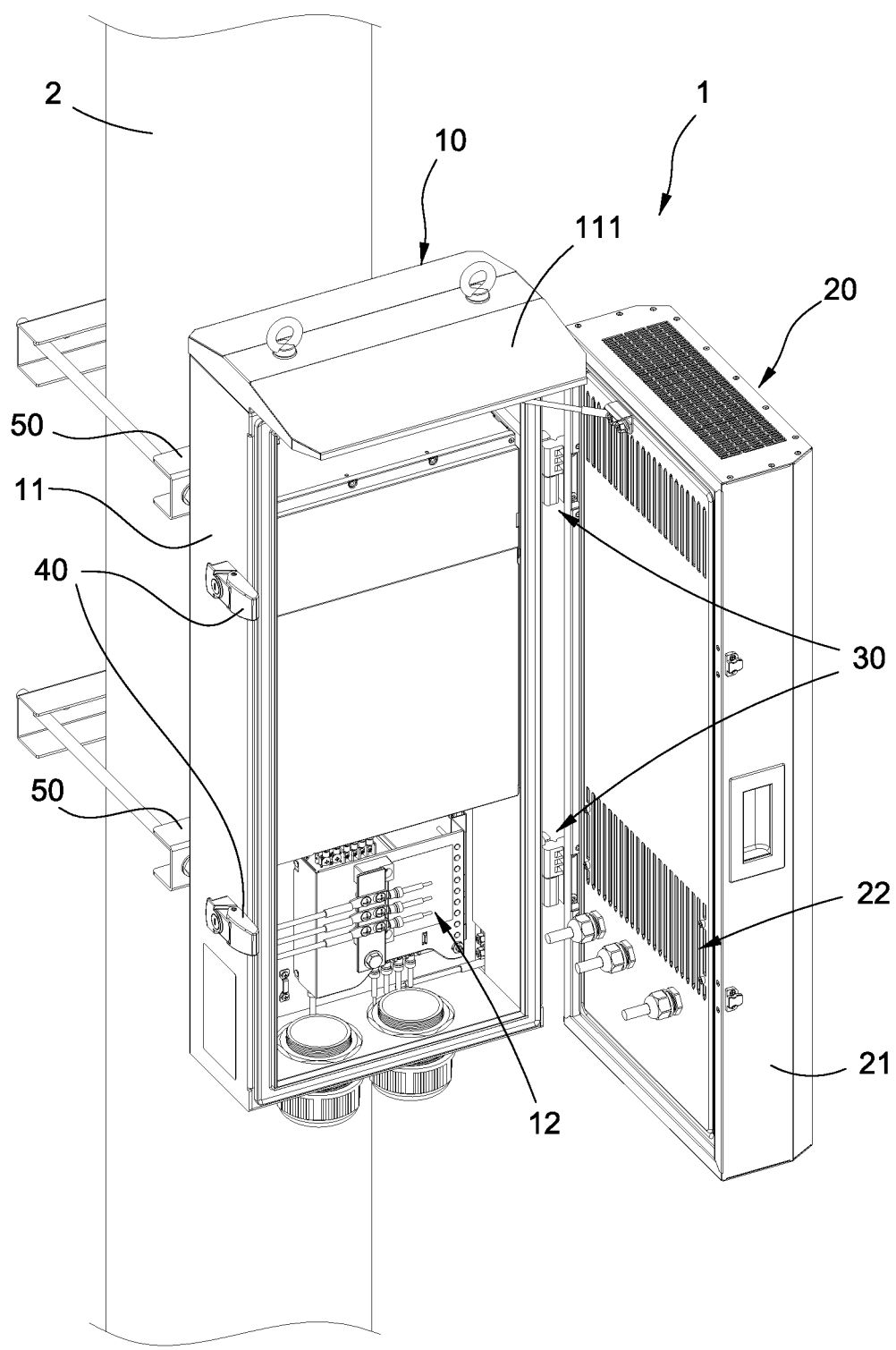
FIG. 1 is an operation schematic view of the telecommunication cabinet of this disclosure.
Figure 2:
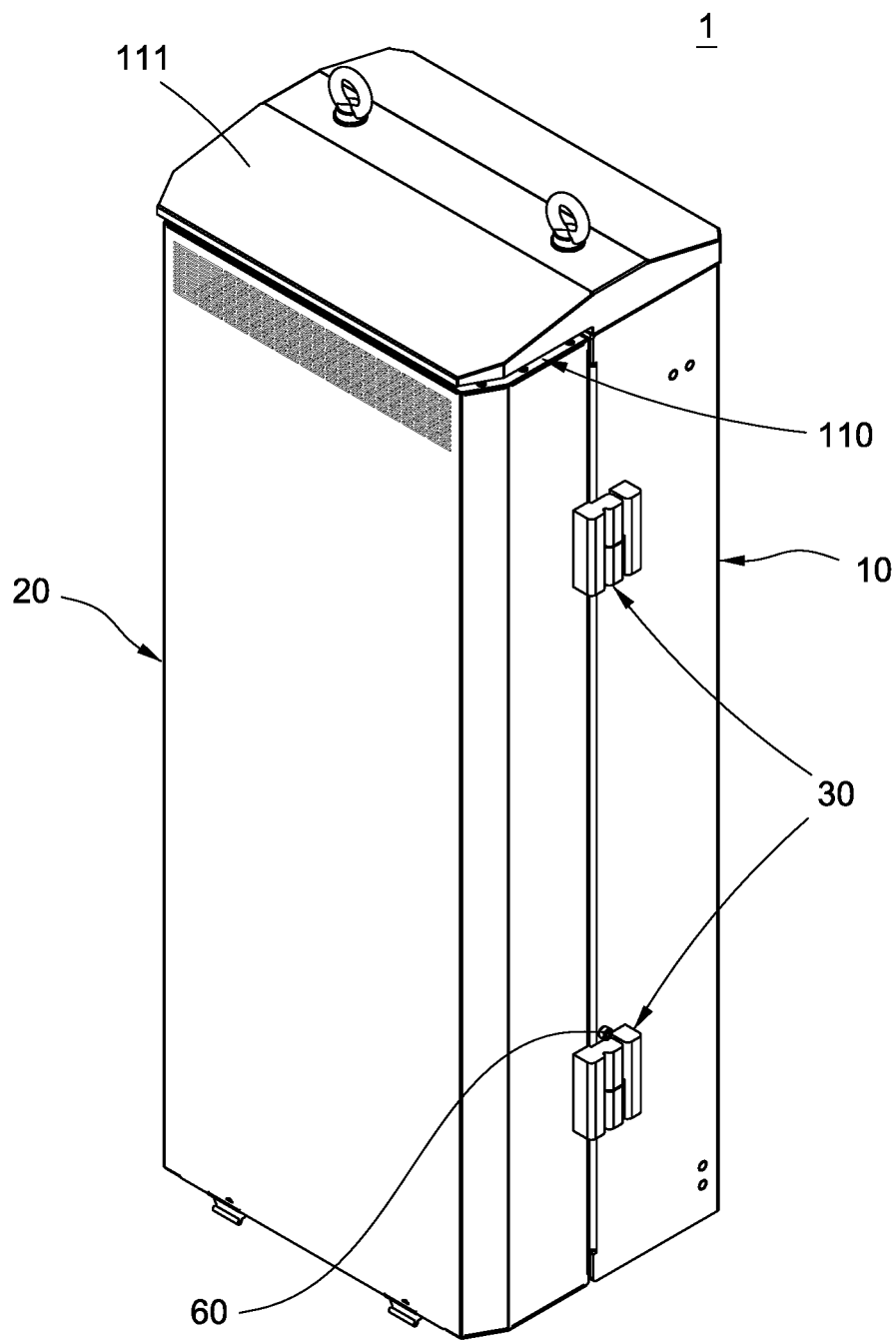
FIG. 2 is a perspective schematic view of the telecommunication cabinet of this disclosure.

Please refer to FIG. 1 and FIG. 2, which depict an operation schematic view and a perspective schematic view of the telecommunication cabinet of this disclosure. The telecommunication cabinet 1 of this disclosure comprises a cabinet body 10, a cabinet door module 20 and a detachable hinge 30. The cabinet door module 20 may be connected with the cabinet body 10 through the detachable hinge 30 or may be detached from the cabinet body 10 for replacing with other cabinet door modules 20 having other functions.

The cabinet body 10 includes a cabinet 11 and a telecommunication module 12 disposed in the cabinet 11. Preferably, the cabinet 11 is provided with a plurality of telecommunication modules 12, and the cabinet 11 is substantially of a rectangular shape. The telecommunication modules 12 may be network communication modules, such as including power amplifier, switching rectifier, splitter, power converter and other electronic component, and the aforementioned components may be arranged according to actual needs.

The cabinet door module 20 includes a cabinet door 21 covering the cabinet body 10 correspondingly and a function module 22 disposed in the cabinet door 21. In this embodiment, the function module 22 is a heat exchange cooling module. In some embodiments, other different function modules may be disposed in the cabinet door 21 for the cabinet door module 20 having different functions.

As shown in FIG. 1, specifically, the telecommunication cabinet 1 further includes a pair of clasp locks 40. The couple of clasp locks 40 are spacedly disposed up and down on the same side of the cabinet 11 and the cabinet door 21, and the clasp locks 40 are located on the opposite side of the detachable hinges 30. In addition, the telecommunication cabinet 1 further includes a pair of brackets 50, and the pair of brackets 50 are connected on the rear side of the cabinet 11. The telecommunications cabinet 1 is attached to a fixed object 2 through the pair of brackets 50. The fixed object 2 may be a supporting pole such as a telecommunication pole, a signal pole, a street lamp pole, or an elevated bridge, etc. Therefore, the telecommunications cabinet 1 may not occupy ground space, and the millimeter waves emitted from the telecommunications cabinet 1 may be prevented from interfering by other electronic devices or blocking by the building.

It should be noted that when the telecommunications cabinet 1 is attached to the fixed object 2, the cabinet body 10 is fixed by the pair of brackets 50 and the cabinet door module 20 is coupled to the cabinet body 10 through the detachable hinge 30 so as to achieve split-type assembly, and the convenience and safety of installation at high-altitude is enhanced.

Please refer to FIG. 2. In this embodiment, the cabinet 11 further includes a convex plate 111 disposed on a top of the cabinet 11. The convex plate 111 protrudes to top of the cabinet door module 20, and a gap 110 is disposed between the convex plate 111 and the cabinet door module 20 (such as the convex plate 111 and the cabinet door module 20 are spaced apart with the gap 110). The gap 110 may be used for heat dissipation, and the convex plate 111 may shield the cabinet door module 20 to prevent rain or external objects from falling into the cabinet door module 20. Thus, the service life of the door module 20 may be extended.

Figure 3:
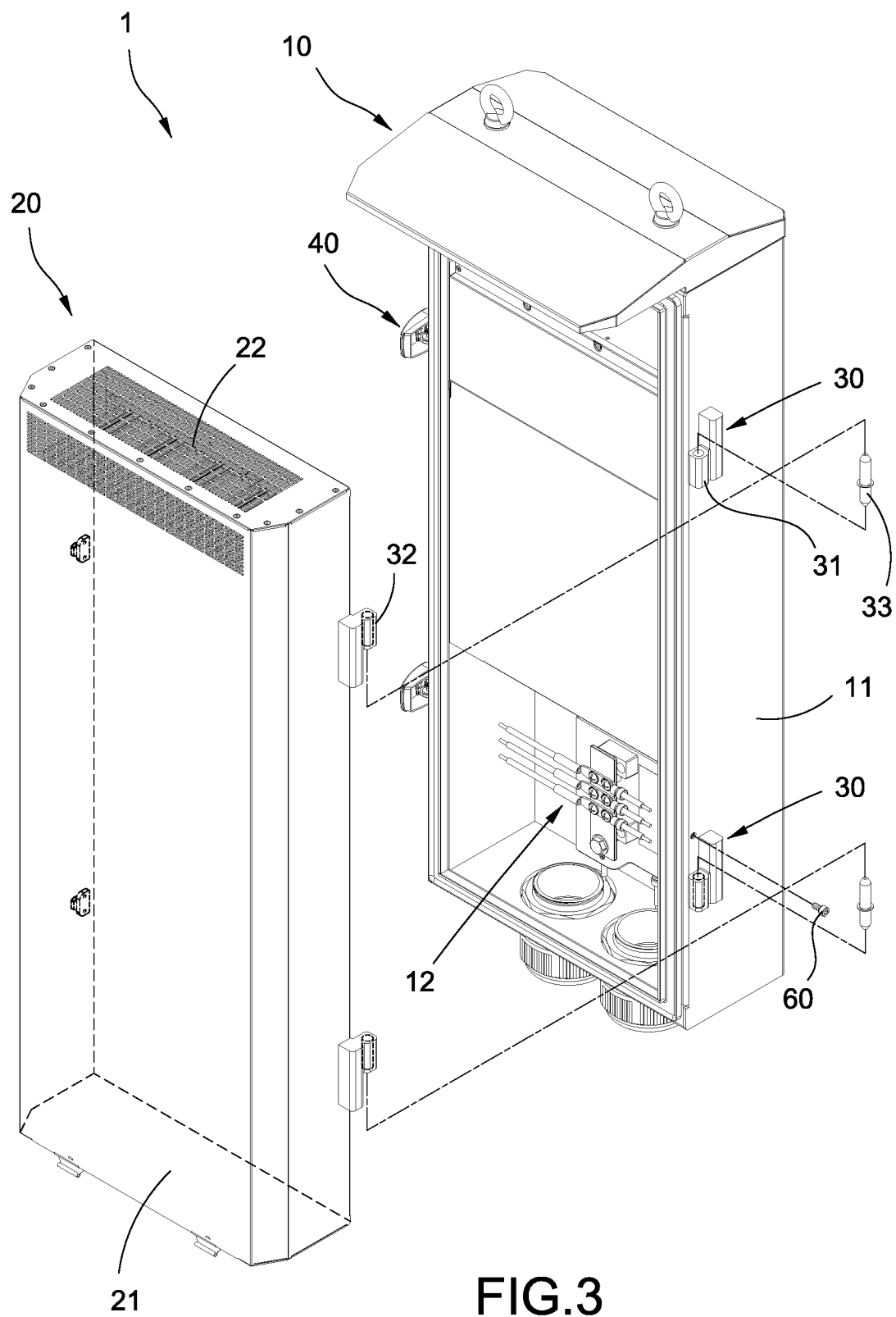
FIG. 3 is a perspective exploded view of the telecommunication cabinet of this disclosure.
Figure 4:
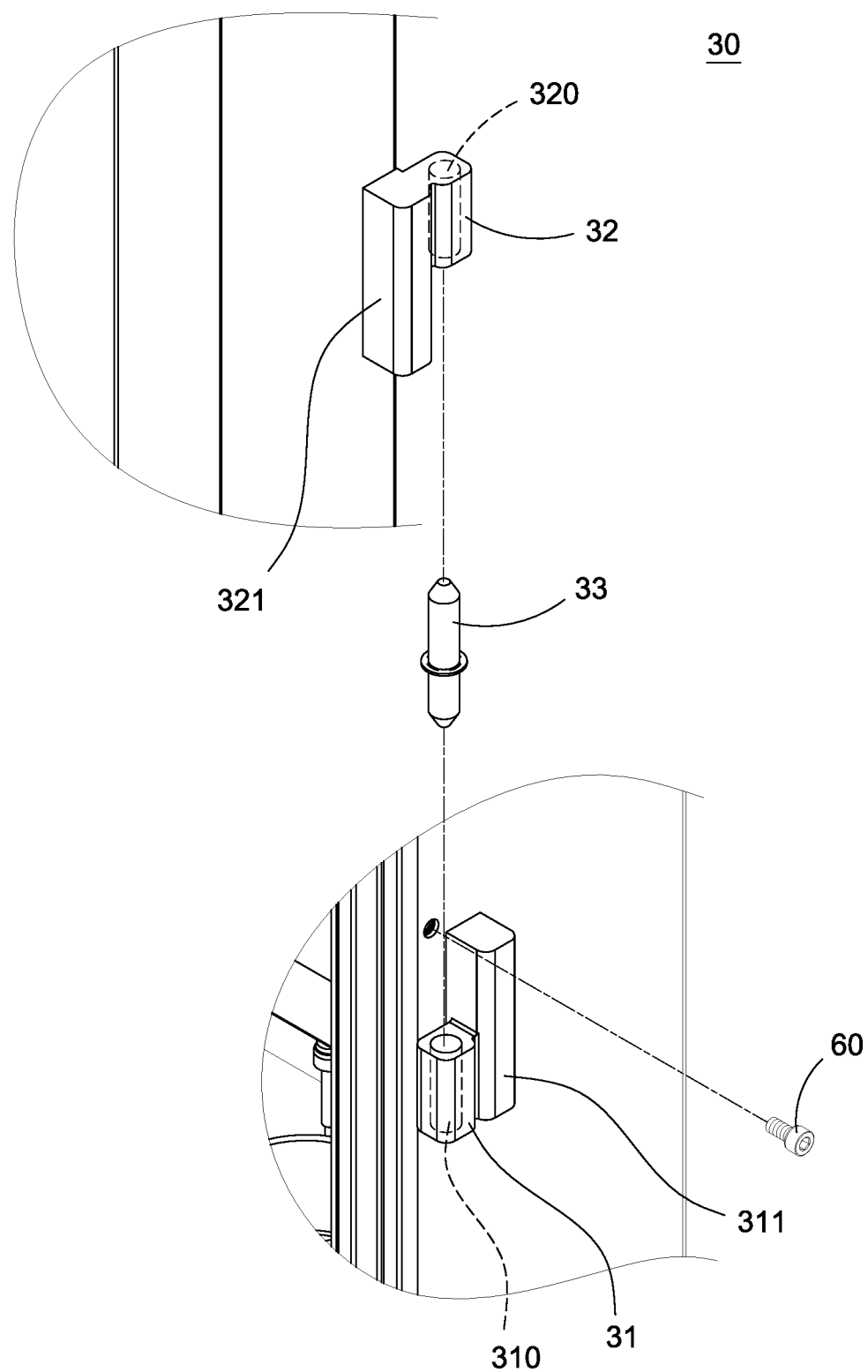
FIG. 4 is a combination schematic view of the detachable hinge of this disclosure.

Please further refer to FIG. 3 and FIG. 4, which depict a perspective exploded schematic view of the telecommunication cabinet of this disclosure and a combination schematic view of the detachable hinge of this disclosure. As shown in FIG. 3, the detachable hinge 30 includes a first shaft seat 31 disposed on one side of the cabinet 11, a second shaft seat 32 disposed on one side of the cabinet door 21 and a pivot shaft 33. Preferably, a number of the detachable hinge 30 is two. The pair of detachable hinges 30 are spacedly disposed up and down on the same side of the cabinet 11 and the cabinet door 21. Moreover, the cabinet door module 20 is pivotally rotatable with respect to the cabinet 11 through the pivot shaft 33 inserted to the first shaft seat 31 and the second shaft seat 32. The cabinet door module 20 is detachably coupled to the cabinet body 10 to facilitate replacement.

Please refer to FIG. 4. The detachable hinge 30 further includes a first supporting seat 311 connected to the first shaft seat 31 and a second supporting seat 321 connected to the second shaft seat 32. Furthermore, the second shaft seat 32 is stacked on the first shaft seat 31 when the cabinet door module 20 is coupled to the cabinet body 10. The arrangement of the first supporting seat 311 and the second supporting seat 321 may respectively provide supporting force for the first shaft seat 31 and the second shaft seat 32 to compensate the force exerted during the pivot shaft 33 being inserted in the first shaft seat 31 and the second shaft seat 32.

Furthermore, the first shaft seat 31 includes a first blind hole 310, and the second shaft seat 32 includes a second blind hole 320. The pivot shaft 33 is inserted in a shaft hole configured by the first blind hole 310 and the second blind hole 320. Therefore, the cabinet door module 20 is connected with the cabinet body 10 through the detachable hinge 30. Similarly, when the cabinet door module 20 is being detached from the cabinet body 10, the cabinet door module 20 may be separated from the cabinet body 10 through the detachable hinge 30.

It is worth noting that in this embodiment, the telecommunications cabinet 1 further includes a blocking screw 60. The blocking screw 60 is disposed on an upper side of the second shaft seat 32 located on lower position so as to prevent the second shaft seat 32 from being detached from the first shaft seat 31. The blocking screw 60 may prevent the cabinet door module 20 from accidentally falling off due to wind blowing (also refer to FIG. 2), or prevent the cabinet door module 20 from being stolen because the cabinet door module 20 may be easily separated from the cabinet body 10.

Moreover, the separation method of the detachable hinge 30 is described as below. When the cabinet door module 20 is being separated from the cabinet body 10, the second shaft seat 32 is detached from the first shaft seat 31 longitudinally (in the vertical direction). At this time, since the blocking screw 60 is arranged on the upper side of the second shaft seat 32, the second shaft seat 32 may not be removed from the first shaft seat 31 before the blocking screw 60 is removed. Accordingly, the cabinet door module 20 may not be separated from the cabinet body 10 with the blocking screw 60 attached.

Although this disclosure has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A telecommunication cabinet, comprising:
   a cabinet body, comprising a cabinet and a telecommunication module disposed in the cabinet;
   a cabinet door module, comprising a cabinet door covering the cabinet body and a function module disposed in the cabinet door; and
   a detachable hinge, comprising a first shaft seat disposed on one side of the cabinet, a second shaft seat disposed on one side of the cabinet door and a pivot shaft;
   wherein, the cabinet door module is pivotally rotatable with respect to the cabinet through the pivot shaft inserted to the first shaft seat and the second shaft seat, and the cabinet door module is detachably coupled to the cabinet body,
   wherein a number of the detachable hinge is two, and two detachable hinges are spacedly disposed up and down on a same side of the cabinet and the cabinet door, and
   wherein the telecommunication cabinet further comprises a blocking screw disposed on an upper side of the second shaft seat located on a lower position so as to prevent the second shaft seat from being detached from the first shaft seat.

2. The telecommunication cabinet according to claim 1, further comprising a pair of brackets connected to a rear side of the cabinet, and the telecommunications cabinet being attached through the pair of brackets.

3. The telecommunication cabinet according to claim 1, wherein the cabinet comprises a convex plate disposed on a top of the cabinet, and the convex plate protrudes to top of the cabinet door module, and a gap is disposed between the convex plate and the cabinet door module.

4. The telecommunication cabinet according to claim 1, wherein the detachable hinge further comprises a first supporting seat connected to the first shaft seat and a second supporting seat connected to the second shaft seat.

5. The telecommunication cabinet according to claim 1, wherein the second shaft seat is stacked on the first shaft seat when the cabinet door module is coupled to the cabinet body.

6. The telecommunication cabinet according to claim 5, wherein the first shaft seat comprises a first blind hole, and the second shaft seat comprises a second blind hole, and the pivot shaft is inserted in a shaft hole configured by the first blind hole and the second blind hole.

7. The telecommunication cabinet according to claim 1, further including a pair of clasp locks spacedly disposed up and down on a same side of the cabinet and the cabinet door, and located on an opposite side of the detachable hinges.

8. The telecommunication cabinet according to claim 1, wherein the function module comprises a heat exchange cooling module.

\* \* \* \* \*